(12) United States Patent
Tomita et al.

(10) Patent No.: US 6,436,723 B1
(45) Date of Patent: Aug. 20, 2002

(54) ETCHING METHOD AND ETCHING APPARATUS METHOD FOR MANUFACTURING SEMICONDUCTOR DEVICE AND SEMICONDUCTOR DEVICE

(75) Inventors: Hiroshi Tomita; Soichi Nadahara, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/408,177

(22) Filed: Sep. 29, 1999

(30) Foreign Application Priority Data

Oct. 16, 1998 (JP) .......................................... 10-295528

(51) Int. Cl.[7] .............................................. H01L 21/00
(52) U.S. Cl. ............................ 438/3; 438/754; 438/745
(58) Field of Search ............................ 438/3, 745, 754, 438/240

(56) References Cited

U.S. PATENT DOCUMENTS

| | | | | |
|---|---|---|---|---|
| 4,747,907 A | * | 5/1988 | Acocella et al. | ............ 156/642 |
| 5,868,855 A | * | 2/1999 | Fukazawa et al. | ............ 134/1.3 |
| 6,127,279 A | * | 10/2000 | Konuma | ..................... 438/745 |

FOREIGN PATENT DOCUMENTS

| | | |
|---|---|---|
| JP | 1-272120 | 10/1989 |
| JP | 4-83340 | 3/1992 |

OTHER PUBLICATIONS

Kashkoush, I. I. et al., "Photoresist Stripping Using Ozone/Deionized Water Chemistry", Electrochemical Society Proceedings, vol. 97–35, pp. 471–479, (1998).

Christenson, K. et al., "Mass Transfer in DI:O$_3$ Resist Stripping", Electrochemical Society Proceedings, vol. 97–35, pp. 481–487, (1998).

* cited by examiner

Primary Examiner—Carl Whitehead, Jr.
Assistant Examiner—Jeff Vockrodt
(74) Attorney, Agent, or Firm—Finnegan, Henderson, Farabow, Garrett, & Dunner, L.L.P.

(57) ABSTRACT

In the etching method, ozone water containing an oxidation agent having an oxidation-reduction potential of 2V or more is supplied onto a metal compound film such as SrRuO film or the like, and the metal compound film is etched by oxidation-reduction reaction involving oxygen. The metal compound film, which is conventionally removed by a physical removal method, can be easily removed by wet etching. Manufacture of a capacitor containing an SrRuO film and the like can thus be facilitated.

12 Claims, 4 Drawing Sheets

ETCHING METHOD AND ETCHING APPARATUS METHOD FOR MANUFACTURING SEMICONDUCTOR DEVICE AND SEMICONDUCTOR DEVICE

BACKGROUND OF THE INVENTION

The present invention relates to an etching method and an etching apparatus for etching inorganic materials, such as metal, metal oxide, and the like, a manufacturing method for manufacturing a semiconductor device, and a semiconductor device.

Etching techniques together with lithography techniques support micro-processing techniques in the process for manufacturing semiconductors. Conventionally, there has been no other ways than physical removal based on polishing, with respect to substances on which a determination has not yet been made as to etching removal with use of a solution. For example, metal oxide ($SrRuO_x$) which is an oxide of strontium (Sr) and Ruthenium (Ru) is one of materials used for FRAM, DRAM, or the like. Since no method for etching has been proposed as to this kind of metal oxide, only the physical removal has been carried out.

Meanwhile, $H_2O_2$ is known as a solution for conventional cleaning. To remove particles and organic materials, $NH_4OH/H_2O_2$ is mainly used and a cleaning solution containing this material is alkaline. To remove metal impurities, $HCl/H_2O_2$ is mainly used and a cleaning solution containing this material is acid. These cleaning solutions are widely used before and after a step in which impurities are involved in the semiconductor process, and the cleaning using them is generally called RCA cleaning. Also, two kinds of cleaning solutions described above are used most generally and are called SC1 and SC2, respectively.

For example, as described above, cleaning with water containing ammonium hydrogen peroxide has been used in particle cleaning. In the system for removing particles, it is considered that particles are lifted off during etching of a silicon substrate using alkaline solution, and the particles and the surface of the silicon substrate are set to an equal potential, thereby inducing mutual repulsion which hinders re-sticking.

Also, in case of removing organic substances by the RCA cleaning, cleaning with $H_2SO_4$ is carried out. However, there are problems concerning scattering of sulfuric acid ion into a clean room and recycling of waste liquids. Hence, ozone-added ultrapure water technique has been proposed. This cleaning method is used as a strong oxidation agent for subjecting an ozone gas to oxidation decomposition. This method is advantageous in that organic substances can be effectively removed by a slight amount of ozone gas and that a waste liquid needs not be recycled since an ozone gas changes into oxygen due to autolysis. If ozone water is thus used for cleaning, the ozone water has a concentration of about 5 to 20 ppm at the room temperature, in general.

Further, $HCl/H_2O_2$ cleaning and $HF/H_2O$ cleaning has been carried out as a method of cleaning metal impurities. By the $HCl/H_2O_2$ cleaning, impurities in the native oxide film cannot be removed although metal impurities sticking to the surface of the silicon substrate and metal impurities sticking to the surface of the native oxide film can be removed. Therefore, a step of removing a native oxide film with use of $HF/H_2O_2$ is carried out additionally. In the method of removing the metal impurities, cleaning with use of ozone water has been proposed lik[0085] in the above case of removing organic materials.

As has been explained, ozone water is used for cleaning of organic impurities on the wafer surface with utilization of an oxidation force of ozone, and cleaning and sterilization of organic impurities in pure water. With respect to solution of organic materials, the ozone water is used only from the viewpoint of cleaning.

In contrast, it has been recently attempted to use ozone water for etching of organic films such as a resist and the like. In case of etching of an organic film, the concentration of ozone in ozone water must be set to about 100 ppm in order to ensure an effective etching rate.

However, even in this case, ozone water is used for the purpose of etching an organic film but is not used for etching and removing inorganic materials such as metal and metal oxide films.

Meanwhile, a CMP (Chemical Mechanical Polishing) method has been widely used as a method of polishing and flattening the surface of a semiconductor substrate. This CMP method is a method of flattening the substrate surface with use of both the chemical operation and the physical operation. By using $(NO_3)_2CeNH_4$ as an oxidation agent to be added to slurry, it is possible to flatten the surface of an $SrRuO_x$ film, which is a metal oxide. However, in case where this material is not used for CMP but is used for chemical etching, $(NO_3)_2CeNH_4$ requires a concentration of several % order in order to ensure an effective etching rate (10 to 100 nm/min). However,. $(NO_3)_2CeNH_4$ is an oxidation agent which causes autolysis and is therefore unstable, so that it is very difficult to maintain a high concentration as a liquid for slurry. Also, since acid-alkaline waste liquid processing is required, this oxidation agent is difficult to treat as an etching solution.

As described above, it is difficult for a conventional etching technique to etch metal oxide materials such as an $SrRuO_x$ and the like used for FRAM, DRAM, and the like. Consequently, there is no other way than carrying out physical removal based on polishing. Even in case of carrying out polishing, since the several % order cannot be stably maintained for $(NO_3)_2CeNH_4$, $(NO_3)_2CeNH_4$ must be dissolved as an additive agent immediately before etching, and thus a liquid for slurry must be prepared. It is thus very difficult to use this method for a semiconductor manufacture process. In addition, la discussion has been made as to use of ozone water for cleaning and etching of an organic film which are carried out before or after the step in which particles and metal impurities of dry etching or the like are generated. However, no consideration has been made as to application to metal and metal oxide films such as an $SrRuO_x$ film and the like.

BRIEF SUMMARY OF THE INVENTION

An object of the present invention is to provide an etching method, an etching apparatus, and a method of manufacturing a semiconductor device, which are capable of easily removing a film made of an inorganic substance which cannot conventionally be etched without physical removal and without polluting the environment.

To achieve the above object, according to a first aspect of the present invention, an etching method comprises the steps of: preparing a substrate having a surface on which a film made of an inorganic substance is formed; and wet-etching the film on the substrate by oxidation-reduction reaction involving oxygen, with use of an etching solution containing an oxidation agent which has an oxidation-reduction potential of 2V or more measured at 25° C., 1 atm.

The oxidation agent captures and releases electrons and generates oxygen, in the oxidation-reduction reaction.

It is desirable that the inorganic substance is difficult to dissolve in water and the oxidation-reduction reaction generates an easily water-soluble or volatile substance from the inorganic substance.

It is also desirable that the inorganic substance is a metal or a metal compound and the inorganic substance is strontium ruthenium compound which is decomposed into an easily water-soluble compound and a ruthenium compound by the oxidation-reduction reaction.

The etching solution is desirably ozone water having a concentration of 5 ppm or more when the etching solution reaches the film.

Desirably, in the step of wet-etching the film, the substrate having the film made, of strontium ruthenium compound is rotated at a speed of 100 rpm or more and the ozone water is directly injected onto the substrate.

Also desirably, in the step of wet-etching the film, the substrate having the film made of strontium ruthenium compound is rotated at a speed of 1000 rpm or more and the ozone water is directly injected onto the substrate.

The etching solution is desirably ozone water having a concentration of 100 ppm or less when the etching solution reaches the film.

According to a second aspect of the present invention, an etching apparatus comprises: a substrate rotation mechanism for rotating a substrate to be processed, which has a thin film made of an inorganic substance, at a rotation speed of 100 rpm or more; and an ozone water supply mechanism provided on the substrate rotation mechanism, for supplying ozone water having a concentration or 5 ppm or more onto a surface of the substrate to be processed, thereby to etch the substrate.

It is desirable that the ozone water supply mechanism supplies ozone water having a concentration of 5 ppm or more when the ozone water reaches the surface of the substrate to be processed.

Desirably, the ozone water supply mechanism supplies the ozone water to a center of the substrate to be processed or vicinity thereof.

Also desirably, the substrate rotation mechanism rotates the substrate at a rotation speed of 1000 rpm or more.

According to a third aspect of the present invention, a method of manufacturing a semiconductor device comprises steps of: forming a first metal compound film on a semiconductor substrate, the first metal compound film being formed of metal elements, at least one of which has compound which is difficult to dissolve in water; forming a second metal compound film on the first metal compound film, the second metal compound film being formed of metal elements, each of which makes an easily water-soluble or a volatile compound; forming a protection film having a desired aperture, on the second metal compound film; and etching the second metal compound film exposed from the aperture, by a solution of water containing ozone.

The second metal compound film is desirably strontium ruthenium compound which is decomposed into an easily water-soluble or a volatile strontium compound through the etching step.

It is desirable that the solution of water containing ozone is ozone water which has a concentration of 5 ppm when the ozone water reaches a surface of the second metal oxide film.

Desirably, in the etching step, the substrate having the second metal compound film made of strontium ruthenium compound is rotated at a speed of 100 rpm or more and the ozone water is directly injected onto the substrate.

According to a fourth aspect of the present invention, a semiconductor device comprises: an insulating layer having a trench; a first metal compound layer formed on an inner surface of the trench; a second metal compound layer which is formed on the inner surface of the trench with the first metal compound inserted therebetween and extends on an upper surface of the insulating layer; a third metal compound layer which fills inside of the trench with the first and the second metal compound layer inserted therebetween and extends on the upper surface of the insulating layer with the second metal compound layer inserted therebetween; and a mask layer formed on the third metal compound layer and covering at least the third metal compound layer.

An outer edge of the third metal compound layer is formed inside an outer edge of the mask layer, and a distance between the outer edge of the third metal compound layer and the outer edge of the mask layer is set to be 0.3 $\mu$m or less.

The third metal compound layer is desirably formed of a strontium-ruthenium compound layer.

According to the present invention, a substrate to be processed which has a film made of an inorganic substance is wet-etched with use of an oxidation agent having an oxidation-reduction potential of 2V or more measured at 25° C., 1 atm, with oxygen involving in oxidation-reduction reaction. As a result, an inorganic film can be easily etched without using physical removal conventionally used.

In addition, by rotating the substrate to be processed at 100 rpm or more during; etching, it is possible to enhance the effect of mixing ozone water and reaction products ($RuO_x$ and $SrO_x$) at the interface where the etching proceeds. As a result, it is possible to remove substances generated at the interface by oxidation-reduction reaction and to introduce a new oxidation agent to the interface, so that etching can be proceeded sufficiently.

In particular, in case of etching a film made of an inorganic substance which is difficult to dissolve in water, those inorganic substances that cannot be dissolved in a normal etching solution can be etched easily by converting those inorganic substances into water-soluble or volatile substances through oxidation-reduction reaction.

In addition, since ozone water is used as an oxidation agent, ozone changes into oxygen due to autolysis through the oxidation-reduction reaction. It is therefore unnecessary to collect waste liquids.

Further, in case where an $SrRuO_x$ film is used as an inorganic film and a $BaSrTiO_x$ film is formed as a lower layer below the inorganic film, only the $SrRuO_x$ film can be selectively etched. That is, the $SrRuO_x$ film is decomposed into $SrO_x$ and $RuO_x$ by oxidation-reduction reaction, but all of Ba, Sr, and Ti are not changed into water-soluble compound (oxide) in a neutral range. Therefore, the $BaSrTiO_x$ film cannot be etched practically. As a result, only the $SrRuO_x$ film can be selectively removed.

Accordingly, a layered film consisting of an $SrRuO_x$ electrode and a $BaSrTiO_x$ insulating film can be used for a memory such as FRAM, DRAM, or the like, so that a device using a ferroelectric material having a perovskite structure can be manufactured easily at low costs without polluting the environment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the following, embodiments of the present invention will be explained with reference to the drawings.

First Embodiment

Figure 1:
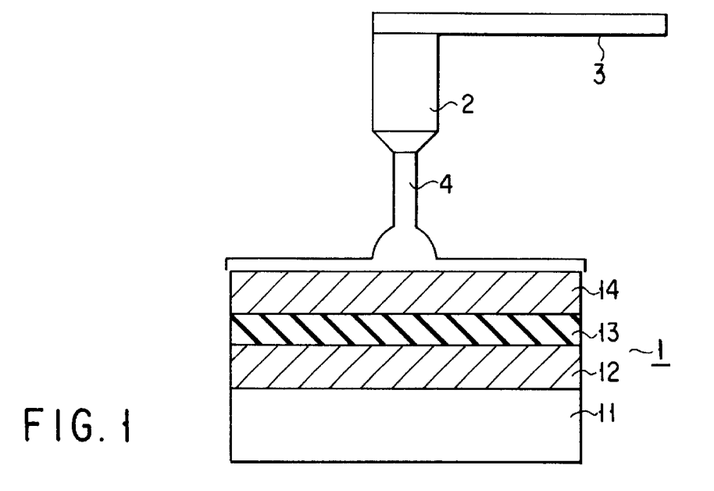
FIG. 1 is a cross-sectional view showing a nozzle and a substrate part, for explaining the etching method according to the first embodiment of the present invention.

FIG. 1 is a cross-sectional view of a nozzle section of a single wafer etching apparatus according to the first embodiment of the present invention and schematically shows an arrangement of a substrate to be processed, on which a film to be etched is formed, and the nozzle. The substrate 1 to be processed, used in the present embodiment, has a flat capacitor consisting of a layered structure in which an $SrRuO_x$ film 12, a $BaSrTiO_x$ film 13, and an $SrRuO_x$ film 14 are sequentially formed on a semiconductor substrate 11. Here, the semiconductor substrate 11 has a diameter of 8 inches and a thickness of 750 μm, and the thickness of the films forming the layered structure are respectively 50, 40, and 50 nm from the lowest film. Meanwhile, a nozzle head 2 made of Teflon is arranged above the surface of the $SrRuO_x$ film 14 such that the tip end of the nozzle is oriented toward the $SrRuO_x$ film 14, by a scan nozzle 3 made of an SUS. Ozone water 4 is injected as an oxidation agent from the tip end of this nozzle head 2. Ozone water 4 is a liquid based on ultrapure water having an ozone concentration of several ppm or more.

Note that the ozone water concentration dealt with in the present embodiment indicates the concentration when the ozone water reaches the surface of the substrate 1 to be processed. That is, the ozone water 4 is a substance whose concentration gradually decreases due to autolysis through a supply route, and therefore, the concentration of the ozone water changes due to the flow rate of the ozone water 4 and the lengths of the nozzle head 2 and the scan nozzle 3. Accordingly, for example, in order to supply ozone water 4 of 5 ppm when the ozone water reaches the substrate 1 to be processed, an ozone water manufacture apparatus not shown must manufacture ozone water 4 having a higher concentration than 5 ppm.

In addition, the substrate 1 to be processed is set on a rotatable wafer table. In this case, the distance between the tip end of the nozzle head 2 and the $SrRuO_x$ film 14 should desirably be small and is set to about 10 cm or less. Also, a mask material made of a resist, a metal film or the like may be formed above the $SrRuO_x$ film 14, if necessary.

Figure 2A:
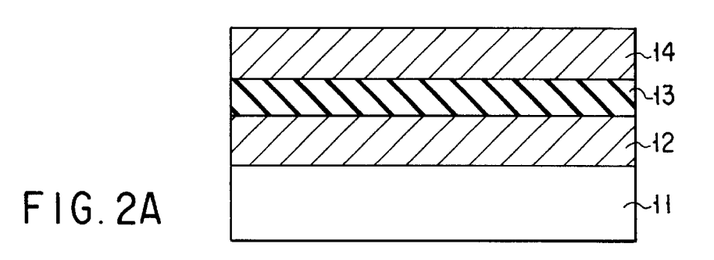
FIGS. 2A to 2C are cross-sectional views showing a substrate to be processed, for explaining the etching method according to the first embodiment in steps.
Figure 2B:
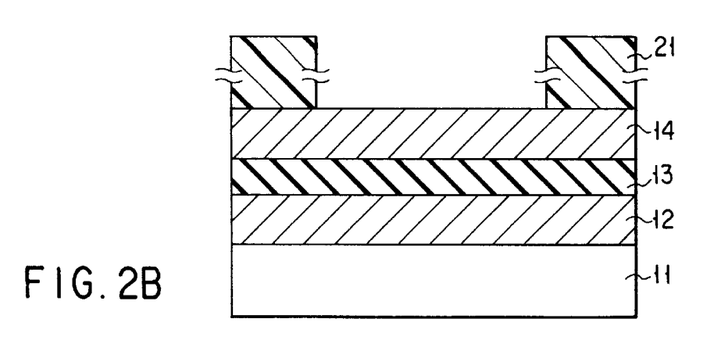
Figure 2C:
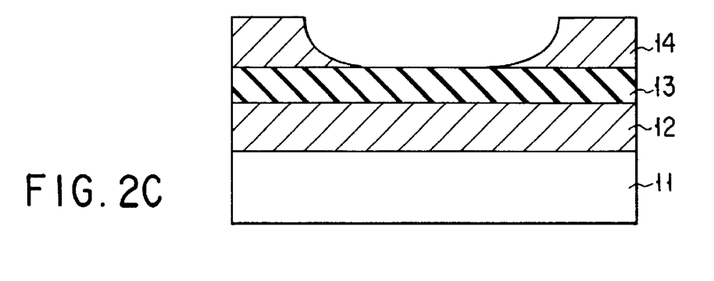

FIGS. 2A to 2C are cross-sectional views of a substrate to be processed and shows the etching method of the present invention in steps. In the following, the present method will be explained along FIGS. 2A to 2C.

At first, as shown in FIG. 2A, a layered structure consisting of an $SrRuO_x$ film 12, a $BaSrTiO_x$ film 13, and an $SrRuO_x$ film 14 is formed on a semiconductor substrate of 8 inch silicon wafer by a CVD method so that the films have respectively thickness of 50, 40, and 50 nm.

Next, a resist 21 having a film thickness of 800 nm is applied on the entire surface of this layered structure, and patterning is carried out by photo-etching process for forming an electrode. Thereafter, the resist 21 is removed from those regions where electrodes are not formed (FIG. 2B). The minimum pattern width is 5 μm.

Next, in the single wafer etching apparatus shown in FIG. 1, ozone water 4 is supplied to the vicinity of the center portion of the substrate 1 to be processed, such that ozone water 4 is injected from the nozzle head 2. At this time, the etching conditions are set such that the rotation speed of the wafer table where the substrate 1 is set is 2000 rpm, the concentration of ozone in the ozone water 4 is 10 ppm, and the flow rate thereof is 1 to 2 (1/min). The $SrRuO_x$ film 14 is processed by a treatment for three minutes. Thereafter, the resist 21 is removed by an oxygen plasma asher (FIG. 2C). In this manner, a line-and-space pattern of 5 μm or less can be processed.

In addition, the resist 21 used as a patterning mask material of the $SrRuO_x$ film 14 is etched by the ozone water 4. Accordingly, it is necessary that an etching selectivity is set between the resist 21 and the $SrRuO_x$ film 14 so that the resist 21 remains until the end of etching. Therefore, it is desirable to use ozone water having a concentration which satisfies the condition that the resist 21 remains until etching ends or to use a resist 21 having a predetermined film thickness or more. For example, the resist having a film thickness of 800 nm before etching is etched to a film thickness of 100 nm by etching for three minutes at the ozone concentration of 10 ppm at 100 rpm. Therefore, if this resist is used to etch the $SrRuO_x$ film, the resist is eliminated in a little more than three minutes. Consequently, the concentration of the ozone water should desirably be 100 ppm or less, for example, with respect to the commercially available resists.

Next, the reasons why the selection of a material and the etching condition in the above-described etching step are appropriate will be explained below.

Figure 3:
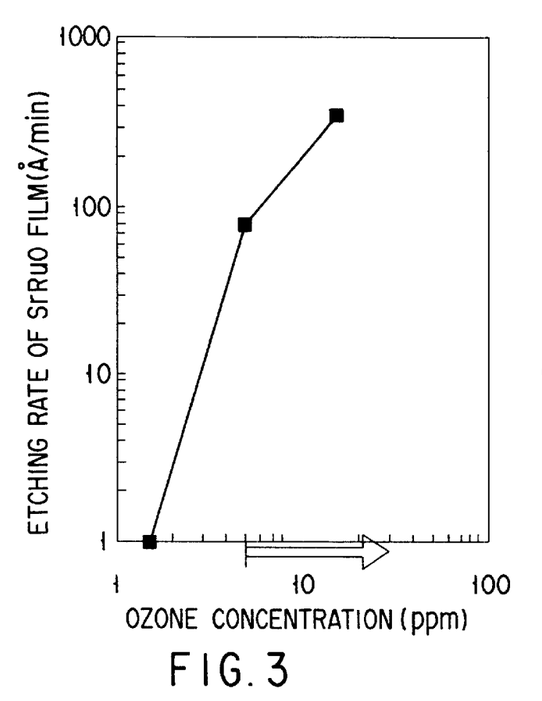
FIG. 3 is a characteristic graph showing the relationship between the concentration of ozone water and the etching rate with respect an $SrRuO_x$ film according to the first embodiment.

At first, the concentration of the ozone water 4 used for etching will be explained. FIG. 3 is a graph showing a result of evaluating the etching of the $SrRuO_x$ film 14 with use of ozone water 4 where the ozone concentration is taken as a parameter. The abscissa indicates the ozone concentration and the ordinate indicates the etching rate of the SrRuO$_x$ film 14. From FIG. 3, it is known that the etching rate is increased as the ozone concentration becomes higher. Taken into consideration that the ozone water is used in semiconductor manufacture process, the process time for which the etching processing continues should desirably be several minutes to several tens minutes, in view of the controllability of the etching rate and the process time. More effectively, it is desirable to use ozone water 4 in which an ozone gas having a concentration of about 5 to 15 ppm, or more preferably more than 15 ppm, dissolves.

Figure 4:
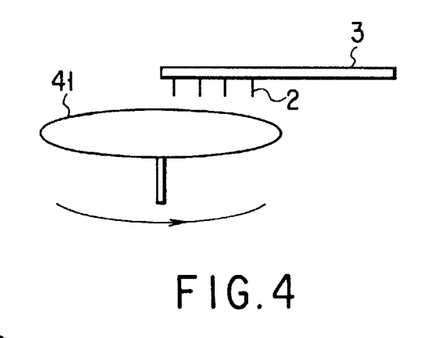
FIG. 4 is a schematic view showing the structure of a single wafer etching apparatus used in an experiment for optimizing the rotation speed of a wafer in the etching method according to the first embodiment.

Next explanation will be made of the reason why the rotation speed of the wafer is set to a predetermined value or more. FIG. 4 is a conceptual view of a single wafer etching apparatus used in an experiment for optimizing the rotation speed of the wafer. Those portions that are common to FIG. 1 will be denoted as the same reference symbols. The nozzle head 2 provided for the nozzle 3 is a multi-hole linear nozzle and is provided with four holes for injecting the ozone water 4. Also, a substrate (wafer) to be processed, which is not shown in the figure, is set on the wafer table 41. An SrRuO$_x$ film is formed as a single layer on the wafer. The experiment conditions are arranged such that the rotation speed of the wafer table 41 is 100 rpm, the concentration of the ozone water 4 is 5 ppm, and the flow rate is about 1 (1/min). The etching processing is performed for two minutes.

Figure 5:
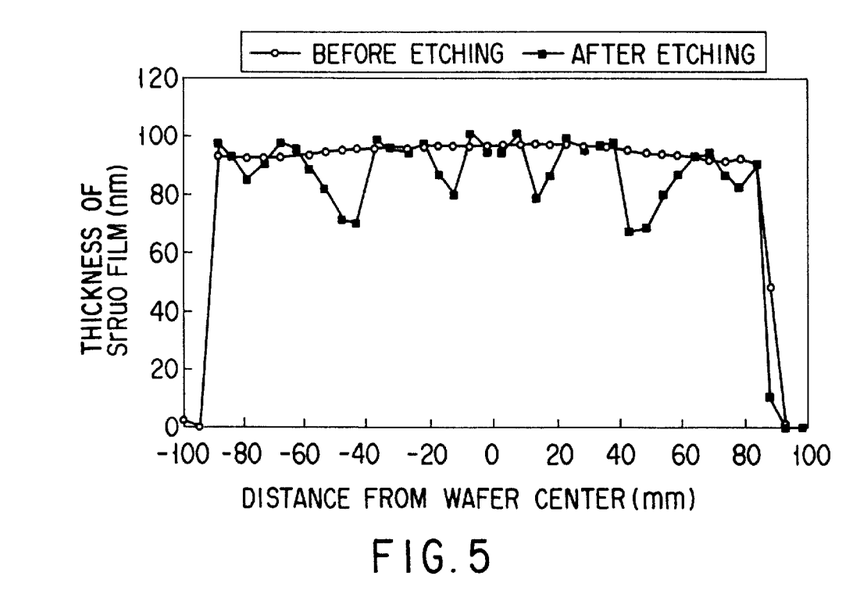
FIG. 5 is a graph showing the film thickness profile of an $SrRuO_x$ film in the wafer diameter direction, compared before and after etching.

FIG. 5 is a graph which shows the in-plane film thickness profile of the SrRuO$_x$ film in the diameter direction of the wafer under the above-described conditions, compared before and after the etching. The abscissa indicates the distance from the center of the wafer and the ordinate indicates the thickness of the SrRuO$_x$. The SrRuO$_x$ film, which was substantially flat before etching, is thinned by a predetermined film thickness through the etching. In this case, this film thickness reduction is not uniform in the diameter direction but the film thickness is reduced greatly at four points. At the other portions than these points, the film thickness is kept unchanged from that before etching. This is because four nozzle holes are provided and ozone wafer 4 is directly injected and supplied onto the wafer from four points, so that only the portions where the ozone water 4 is directly injected and the vicinities thereof are etched. Although those portions where the ozone water 4 having a high concentration is not directly injected are continuously supplied and wetted with the ozone water 4 infected from four points, these portions of the SrRuO$_x$ film other than the portions where the ozone water 4 is directly injected are not effectively etched.

That is, in case where the wafer is rotated at a low speed of 100 rpm or so, it is apparent that a sufficient etching rate cannot effectively be obtained in those portions where ozone water is not directly injected. That is, a mixing effect is effected and etching proceeds efficiently as described above, at those portions where the ozone water is supplied in a direction substantially vertical to the wafer surface with a water pressure of 1 to 2 kgf/cm$^2$ or so. However, at those portions where ozone water is not directly injected, the mixing effect is small at a low rotation speed (10 to 100 rpm), so that the etching rate is small.

Note that the same etching effect as obtained by directly injecting ozone water to the wafer can be obtained by increasing the water pressure of the supplied ozone water. Although the effective water pressure of the ozone water is preferably about 1 kgf/cm$^2$ or more, an effective etching rate cannot be attained at a low rotation speed of 100 rpm or so, with this water pressure.

From the above, it can be estimated that an effective etching rate varies mainly depending on three parameters of the concentration of ozone water, the water pressure, and the rotation speed.

Figure 6:
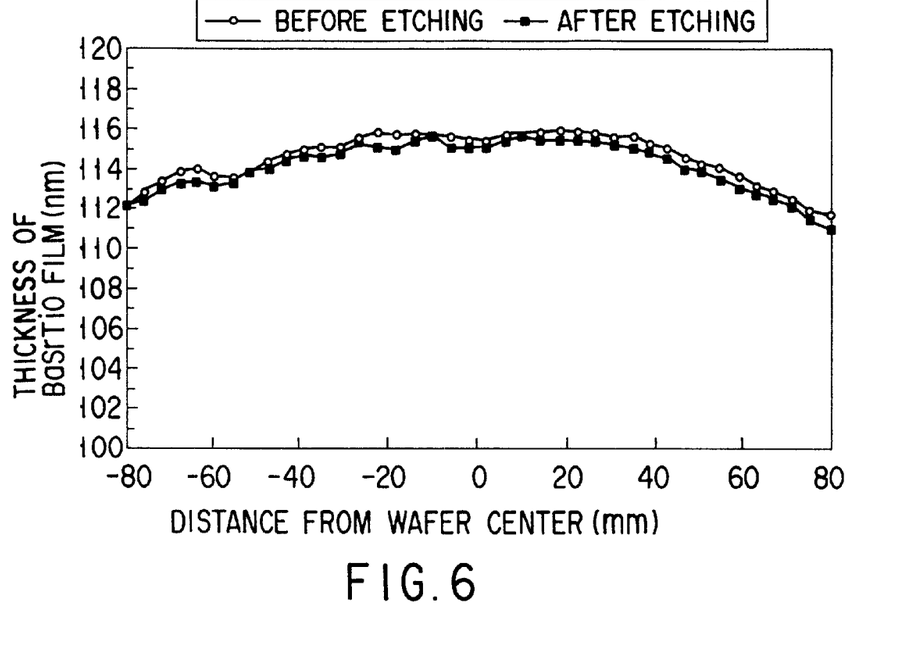
FIG. 6 is a graph showing the film thickness profile of a $BaSrTiO_x$ film in the wafer diameter direction, compared before and after etching.

Next, explanation will be made with respect to etching materials to which the present invention is applicable. Like FIG. 5, FIG. 6 is a graph showing the distribution of the film thickness in the wafer diameter direction where a BaSrTiO$_x$ film formed as a single layer on a flat wafer is subjected to etching processing with ozone water with use of the single wafer etching apparatus shown in FIG. 4. The abscissa indicates the distance from the wafer center and the ordinate indicates the thickness of the BaSrTiO$_x$ film.

As shown in FIG. 6, the thickness of the BaSrTiO$_x$ film does not substantially vary before and after the etching. Therefore, the BaSrTiO$_x$ film, although it is a metal compound (oxide), is not etched by ozone water. Although the same experiment has been made with respect to tantalum oxide TaO$_x$, the film is not substantially etched, like the BaSrTiO$_x$ film. That is, all kinds of metal compound (oxide) cannot be dissolved by ozone water. The reason why the material species are limited will be explained below with reference to an SrRuO$_x$ film and a BaSrTiO$_x$ film as examples. Note that the values of the solubility and the melting points described below are cited from "RIKAGAKUJITEN, FOURTH EDITION (IWANAMI SHOTEN)".

An SrRuO$_x$ film is decomposed into SrO$_x$ and RuO$_x$ through oxidation-reduction reaction. SrO$_x$ is an easily soluble substance which extremely reacts with water. RuO$_x$ is a substance which is insoluble in water when RuO$_x$ is RuO$_2$. However, when RuO$_x$ is RuO$_4$, it is a volatile substance which soluble in water. The solubility of RuO$_4$ is 2.21 g per 100 g of water and a boiling point of 40° C. Accordingly, if SrRuO$_x$ changes to SrO$_x$ and RuO$_4$, dissolution and aerification can be achieved.

In contrast, in case of a BaSrTiO$_x$ film, there is a possibility that this film is decomposed into BaO$_x$, SrO$_x$, and TiO$_x$. Only a slight amount BaO$_2$ is dissolved. The solubility is 0.168 g per 100 g of water at 25° C. Simply comparing BaO$_2$ and RuO$_4$, it is considered that the etching rate of BaO$_2$ is 10 or more times lower than that of RuO$_4$. In addition, TiO$_x$ is a substance which is insoluble in water and is not substantially dissolved in ozone water of a neutral range about pH7. Therefore, TiO$_x$ can be said to be a substance which is insoluble in ozone water.

As a result of this, the factors which makes BaSrTiO$_x$ insoluble in ozone water at the room temperature can be guessed that BaO$_x$ is difficult to be dissolved in ozone water and TiO$_x$ cannot be dissolved in ozone water. Meanwhile, SrRuO$_x$ can be dissolved in ozone water because SrO$_x$ is soluble in ozone water, and dissolution and vaporization can be achieved if RuO$_x$ becomes RuO$_4$.

Accordingly, if a layer structure consisting of SrRuO$_x$, BaSrTiO$_x$, and SrRuO$_x$ is formed in this order as shown in FIG. 2A, only the SrRuO$_x$ film 14 as its upper layer can be etched and removed. Note that the same advantages can be obtained if the capacitor is formed of a layered structure of: SrRuO$_x$, PbZrTiO$_x$, and SrRuO$_x$; SrRuO$_x$, SrBlTaO$_x$, and SrRuO$_x$; or SrRuO$_x$, SrTiO$_x$, and SrRuO$_x$.

From the above, inorganic substances which can be etched by the present embodiment are limited to those substances that contain only water-soluble or volatile substances but do not contain substances which are difficult to be dissolved in water.

Figure 7:
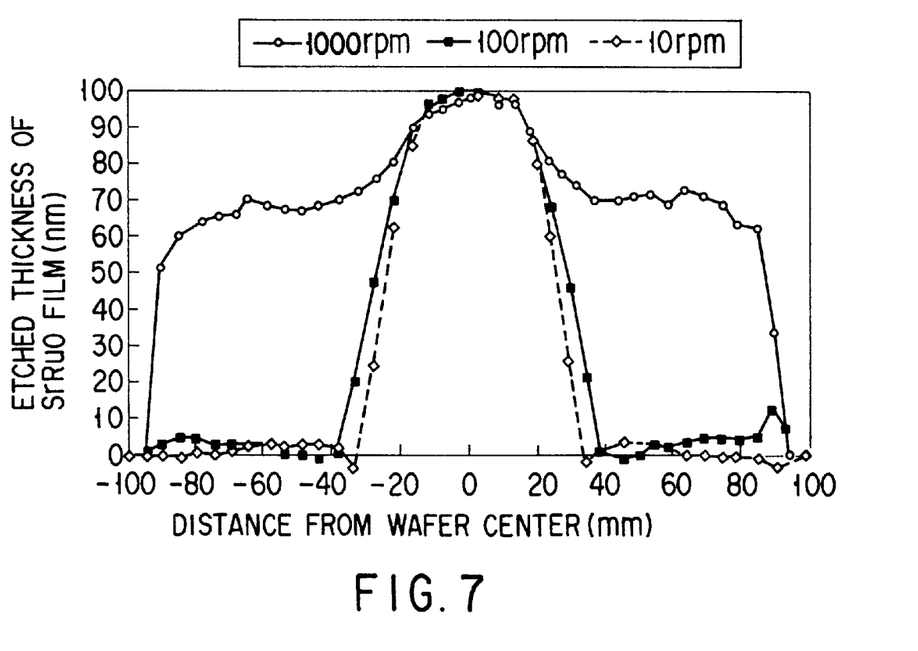
FIG. 7 is a graph showing the film thickness profile in the wafer diameter direction in case where etching is carried out while an $SrRuO_x$ film formed as a single layer on a flat wafer is rotated at three rotation speeds.

Next, explanation will be made of an optimum rotation speed of the wafer. FIG. 7 is a graph which shows the film thickness profile after etching in the diameter direction of the $SrRuO_x$ film formed as a single layer on a flat wafer, with the rotation speed of the wafer as a parameter. This $SrRuO_x$ film is etched by supplying ozone wafer having a concentration of 15 ppm to the center of a wafer from an upper portion by means of the single wafer etching apparatus shown in FIG. 1. Since ozone water is directly supplied to the center portion of the wafer, the etching amount around the center portion becomes substantially constant without depending on the rotation speed. The etching amount at the peripheral portion of the wafer depends on the rotation speed, and etching is not substantially effected when the rotation speed is 100 rpm or less. That is, if the rotation speed is increased to about 1000 rpm or so, etching can be effected even at the peripheral portion of the wafer. If the rotation speed is increased to about 2000 rpm or so, uniformity increases much more.

More specifically, when the ratio of the wet etching rates of SrRuO is examined among different rotation speeds, at the portion distant from the center of the wafer by 50 mm, the etching rate ratio is 1.45 in the case of 2000 rpm/1000 rpm and is 1.31 in the case of 1500 rpm/1000 rpm. That is, as the rotation speed is increased, the etching rate becomes larger and the difference between the etching rates at the peripheral portion of the wafer and the center portion thereof becomes smaller. As a result, if the rotation speed is increased to about 2000 rpm or so, the difference between etching rates is substantially eliminated in case of a 8-inch wafer.

From these results, it is known that the etching behavior varies depending on the method of supplying ozone water to a wafer (hard parameter) and the rotation speed of a wafer (process parameter). The mechanism that the $SrRuO_x$ film is etched at the portion where ozone wafer is not directly injected (periphery of the wafer) indicates that the portion of ozone water which has not reacted with the $SrRuO_x$ film is supplied to the periphery of the wafer by rotating the wafer at a high speed, so that etching is related to two factors, one of which is a function of eliminating a supply-limited state, and another of which is mixing (stirring) which occurs between ozone water accelerated by a centrifugal force and the $SrRuO_x$ film. That is, stirring is effected between ozone water and the $SrRuO_x$ film, so that water-soluble $SrO_x$ generated by oxidation-reduction reaction is removed from the reacting portion, with a result that etching further proceeds at the same portion.

Next, the reason why ozone water is used as an oxidation agent will be explained below. Hydrogen peroxide water and ammonium persulfate water were examined as other etching solutions than ozone water, and as a result, etching cannot be effectively achieved by hydrogen peroxide water $H_2O_2$ having an oxidation force as well. In the following, oxidation-reduction reaction and standard oxidation-reduction potentials at 25° C., 1 atm will be cited below for each of $H_2O_2$, $S_2O_8^{2-}$, and $O_3$.

$$H_2O_2+2H^++2e^-=2H_2O \quad 1.776V \tag{1}$$

$$S_2O_8^{2-}+2H^++2e^-=2HSO_4^- \quad 2.123V \tag{2}$$

$$O_3+2H^++2e^-=O_2+H_2O \quad 2.076V \tag{3}$$

As shown in the above-described equation (1), the oxidation-reduction potential of $H_2O_2$ is 1.776V. This indicates that an oxidation-reduction potential of 1.7V or so is not enough to etch an $SrRuO_x$ film and an oxidation-reduction potential of at least 2V or so is necessary.

Meanwhile, it has been also found out that etching cannot be achieved even by ammonium persulfate $(NH_4)_2S_2O_8$ having an oxidation-reduction potential of about 2V or more. From the examination results using the hydrogen peroxide water and ammonium persulfate water, not only an oxidation force of about 2V or so, which is substantially equal to ozone water, is required according to the definition concerning electron capture, but also oxygen need be involved in oxidation-reduction reaction, in order to etch the $SrRuO_x$ film. That is, to change the film into water-soluble or volatile metal compound (oxide), not only $e^-$ is captured or released in oxidation-reduction reaction but also oxygen atoms need be generated.

$O_3$ is able to generate oxygen. atoms through the decomposition reaction and to oxidize a substance. In the reaction equation (3), active oxygen is generated due to decomposition of ozone, and subsequently, water is generated from this active oxygen and hydrogen ions. Active oxygen during this reaction contributes to decomposition of SrRuO. Also, in the reaction equation (1), active oxygen is generated thereby generating water. However, since the energy of the active oxygen is lower than ozone by about 0.3V, SrRuO cannot be decomposed. Meanwhile, in case of $NH_4S_2O_8$, no oxygen atoms are involved in the oxidation-reduction reaction. Accordingly, it has been found that at least the oxidation-reduction reaction to which oxygen atoms contribute is required for dissolution of SrRuO.

In addition, etching could not be achieved in an etching test concerning SrRuO using an ozone gas, unlike ozone water. That is, if ozone is used as ozone water, SrRuO can be changed into a water-soluble substance. However, in an ozone gas in which both of Sr and Ru of SrRuO are not changed into volatile substances, etching cannot be achieved.

The method in which metal oxide is thus oxidized in a solution is achieved by supplying an oxidation agent. However, it is found that etching cannot be achieved by simply supplying a solution added with an oxidation agent. Although the-oxidation agent has an oxidation force determined depending on the oxidation-reduction potential; it is necessary that the oxidation-reduction potential is high and active oxygen is involved in reaction in order to decompose a compound of this kind of metal oxide into a water-soluble metal compound (oxide). Specifically, the oxidation-reduction potential need be 2V or more.

In the present invention, explanation has been made of a case of applying the present invention to process of forming an electrode of a flat capacitor. However, the present invention is naturally applicable to other processes. For example, in case where an $SrRuO_x$ film is formed on a wafer by a sputtering apparatus or by CVD (Chemical Vapor Deposition), the $SrRuO_x$ film sticks to a quartz tube or wafer holding tool. In this case, the $SrRuO_x$ film can be removed by etching with use of ozone water. Accordingly, it is not necessary to remove the film by physical polishing as is done in a conventional apparatus, but the $SrRuO_x$ film can be removed simply and easily by supplying ozone water to a cleaning mechanism of a conventional semiconductor manufacturing apparatus.

Although the above embodiment shows a case of using a resist 21 as a patterning mask material for the $SrRuO_x$ film 14, another material may be used. For example, TiN can be used as the mask material. In case where a TiN film is formed on the $SrRuO_x$ film, patterning of an SrRuO film can be achieved even with a thin film thickness of 50 nm or less since the TiN film is not etched by ozone water. In this case, ozone water processing for a longer time is possible than the time taken for a resist, since $TiO_x$ is not removed by etching even if the TiN film is oxidized by ozone water. Accordingly, etching-processing of batch processing type with use of ozone water is enabled, instead of a single wafer etching apparatus used in the present embodiment. In case of performing batch-type etching processing, uniformity of etching can be improved by rotating a wafer in an etching apparatus. In addition, although the above explanation shows the case where the ozone water used as an etching solution is a neutral solution based on ultrapure water, any acid or alkali solution can be used as long as the concentration when the solution reaches the surface of the substrate to be processed is substantially equal to the concentration required for ozone water based on ultrapure water.

Also, the film to be etched may be any film as long as the film contains an inorganic substance such as a metal compound composed of Ca, Sr, Ba, Oxygen, and the like and is also a substance which can be converted into a water-soluble or volatile substance through oxidation-reduction reaction but is not a substance which is converted into a substance which is difficult to dissolve in water.

Second Embodiment

As a second embodiment, explanation will be made of a method of manufacturing a cubic capacitor with use of the etching method explained in the first embodiment. FIGS. 8A to 8G are cross-sectional views showing the steps of manufacturing a capacitor to be incorporated in a semiconductor device.

Figure 8A:
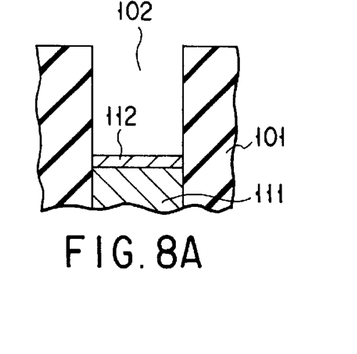
FIGS. 8A to 8G are cross-sectional views showing the method of manufacturing a capacitor according to the second embodiment of the present invention in steps.
Figure 8B:
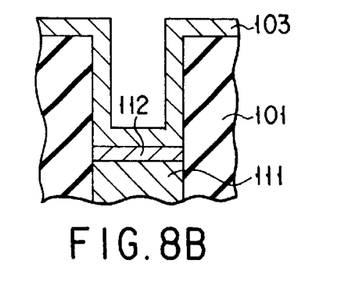

At first, as shown in FIG. 8A, a trench 102 is formed on a W-plug electrode 111 in a silicon oxide film 101 formed on a semiconductor substrate (not shown), by reactive ion etching (RIE). A barrier layer 112 made of TiN is formed on the surface of the W-plug electrode 111. Thereafter, an SrRuO electrode 103 as a lower electrode is formed on the entire surface of the oxide film 101. At this time, an SrRuO electrode 103 is formed on the inner wall and bottom surface of the trench 102 (FIG. 8B).

Figure 8C:
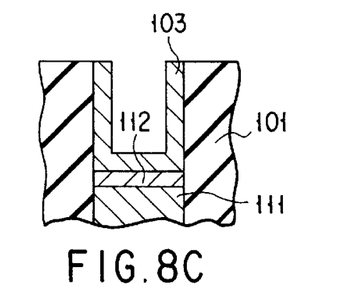

Subsequently, the surface of an oxide film 103 is polished by a CMP method thereby to remove the SrRuO film 103 on the surface. In this manner, the SrRuO electrode 103 remains only on the inner wall and the bottom surface of the trench 102.

Figure 8D:
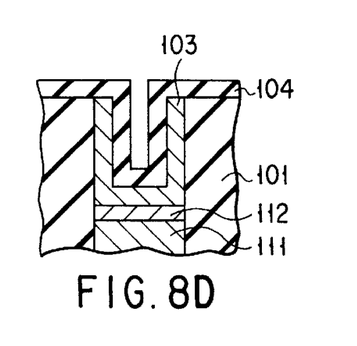

Next, a $BaSrTiO_x$ film 104 as a dielectric film is formed on the entire surface of the oxide film 101. At this time, a $BaSrTiO_x$ film 104 is formed on the inner wall and the bottom surface of the trench 102 with the SrRuO electrode 103 inserted therebetween (FIG. 8D).

Figure 8E:
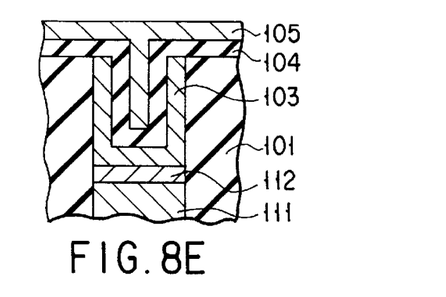

Next, an SrRuO electrode 105 as an upper electrode is formed on the entire surface of the $BaSrTiO_x$ film 104. At this time, the remaining space in the trench 102 is filled with the $BaSrTiO_x$ film 104 (FIG. 8E).

Figure 8F:
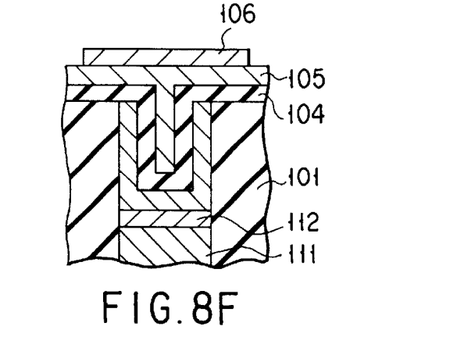

Next, a TiN film as a hard mask for processing the upper electrode is formed and processed into a mask shape by a photolithography step and an RIE step, thereby to form a TiN mask 106 (FIG. 8R).

Figure 8G:
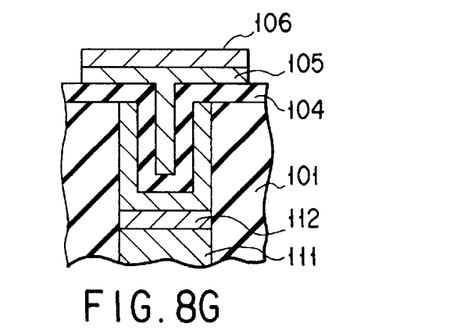

Next, ozone water having a high concentration (e.g., 10 ppm) is used to etch the SrRuO electrode 105 as the upper electrode like in the first embodiment (FIG. 8G). FIG. 8G shows a case where the SrRuO electrode 105 is just etched into the shape of the TiN mask 106, and FIG. 9 shows a case of over-etching.

Figure 9:
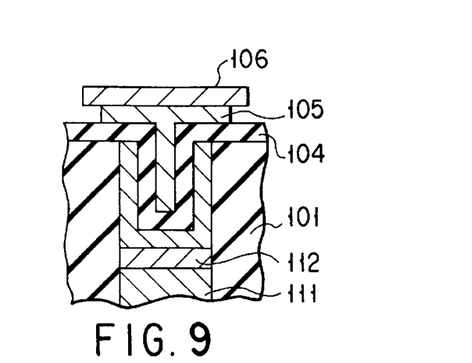
FIG. 9 is a cross-sectional view of a capacitor, showing the case where over-etching occurs in the step of FIG. 8G.

If the electrode is over-etched as shown in FIG. 9, the tolerable range of the over-etching amount is 0.1 to 0.3 $\mu$m from the edge of the TiN mask 106. This is defined by the fact that the SrRuO electrode 105 as an upper electrode must always exist above the SrRuO electrode 103 as a lower electrode and the fact that the outer edge of the TiN mask 106 must be positioned at about 0.3 $\mu$m from the edge of the trench, for the sake of miniaturization. Accordingly, even if the etching rate of the upper electrode SrRuO film 105 varies within the wafer surface thereby to cause an over-etched portion, an undercut amount of 0.1 to 0.3 $\mu$m is tolerable.

Meanwhile, if the ozone etching according to the present invention is effected on a SrRuO film, variations of the etching rate are always caused within the wafer surface as explained with reference to FIG. 7. As a result of this, the undercut amount differs between a wafer center portion and an edge portion. Specifically, the undercut amount at the wafer center portion becomes larger than that at the wafer edge portion. However, according to the etching method of the present invention, it is surely possible to realize a device which involves only a difference of 0.3 $\mu$m or less between the undercut amount at a center portion of a wafer and the under cut amount at an edge portion thereof, as explained with reference to FIG. 7.

As has been described above, according to the present invention, a film made of an inorganic substance which cannot conventionally be etched can be etched easily by means of oxidation-reduction reaction which adopts a oxidation-reaction potential of 2V or more and which is based on oxidation-reduction reaction based on an oxidation agent in which oxygen is involved, without physically removing the film. In addition, with use of this invention, manufacture of a capacitor using an SrRuO electrode and the like is facilitated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An etching method comprising the steps of:
   preparing a substrate having a surface on which a film made of an inorganic metal oxide compound including at least one of strontium and ruthenium, which is decomposed into an easily water soluble compound and at least one of a ruthenium compound and a strontium compound by an oxidation-reduction reaction involving oxygen; and
   wet-etching the film on the substrate by oxidation-reduction involving oxygen, with use of an etching solution containing an oxidation agent which has an oxidation-reduction potential of 2V or more measured at 25° C., 1 atm.

2. The etching method according to claim 1, wherein the oxidation agent captures and releases electrons and generates oxygen, in the oxidation-reduction reaction.

3. The etching method according to claim 1, wherein the inorganic metal oxide compound is difficult to dissolve in water, and the oxidation-reduction reaction generates an easily water-soluble or volatile substance from the inorganic metal oxide compound.

4. The etching method according to claim 1, wherein the etching solution is ozone water having a concentration of 5 ppm or more when the etching solution reaches the film.

5. The etching method according to claim 4, wherein in the step of wet-etching the film, the substrate having the film including at least one of strontium and ruthenium is rotated at a speed of 100 rpm or more and the ozone water is directly injected onto the substrate.

6. The etching method according to claim 4, wherein in the step of wet-etching the film, the substrate having the film including at least one of strontium and ruthenium is rotated at a speed of 1000 rpm or more and the ozone water is directly injected onto the substrate.

7. The etching method according to claim 1, wherein the etching solution is ozone water having a concentration of 100 ppm or less when the etching solution reaches the film.

8. A method of manufacturing a semiconductor device, comprising the steps of:

forming a first metal compound film on a semiconductor substrate, the first metal compound film being formed of metal elements, at least one of which has compound which is difficult to dissolve in water;

forming a second metal compound film on the first metal compound film, the second metal compound film being formed of metal elements, each of which makes an easily water-soluble or a volatile compound;

forming a protection film having a desired aperture, on the second metal compound film; and etching the second metal compound film exposed from the aperture, by a solution of water containing ozone.

9. The method according to claim 8, wherein the second metal compound film is strontium ruthenium compound which is decomposed into an easily water-soluble or a volatile strontium compound through the etching step.

10. The method according to claim 9, wherein the solution of water containing ozone is ozone water which has a concentration of 5 ppm when the ozone water reaches a surface of the second metal oxide film.

11. The method according to claim 9, wherein in the etching step, the substrate having the second metal compound film made of strontium ruthenium compound is rotated at a speed of 100 rpm or more and the ozone water is directly injected onto the substrate.

12. An etching method comprising the steps of:

preparing a substrate having a surface on which a film made of an inorganic substance is formed; and wet-etching the film on the substrate by oxidation-reduction reaction involving oxygen, with use of an etching solution containing an oxidation agent which has an oxidation-reduction potential of 2V or more measured at 25° C., 1 atm;

wherein the inorganic substance is a strontium ruthenium compound which is decomposed into an easily water-soluble compound and a ruthenium compound by the oxidation-reduction reaction.

* * * * *

UNITED STATES PATENT AND TRADEMARK OFFICE
CERTIFICATE OF CORRECTION

PATENT NO. : 6,436,723 B1
DATED : August 20, 2002
INVENTOR(S) : Tomita et al.

It is certified that error appears in the above-identified patent and that said Letters Patent is hereby corrected as shown below:

<u>Title page, Item [54] and Column 1, line 2,</u>
Change "APPARATUS" to -- APPARATUS, --;

<u>Title page, Item [54] and Column 1, line 4,</u>
Change "DEVICE" (first occurrence) to -- DEVICE, --.

Signed and Sealed this

Third Day of June, 2003

JAMES E. ROGAN
*Director of the United States Patent and Trademark Office*